United States Patent
Chuang et al.

(10) Patent No.: US 10,162,925 B2
(45) Date of Patent: Dec. 25, 2018

(54) CELL LAYOUT OF SEMICONDUCTOR DEVICE

(71) Applicant: TAIWAN SEMICONDUCTOR MANUFACTURING CO., LTD., Hsinchu (TW)

(72) Inventors: Yi-Lin Chuang, Taipei (TW); Huang-Yu Chen, Hsinchu (TW); Yun-Han Lee, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 266 days.

(21) Appl. No.: 14/859,162

(22) Filed: Sep. 18, 2015

(65) Prior Publication Data

US 2017/0083654 A1 Mar. 23, 2017

(51) Int. Cl.
*G06F 17/50* (2006.01)

(52) U.S. Cl.
CPC ...... *G06F 17/5072* (2013.01); *G06F 17/5077* (2013.01); *G06F 17/5081* (2013.01); *G06F 2217/62* (2013.01)

(58) Field of Classification Search
CPC ......... H03K 19/17796; H03K 19/1732; H03K 19/17736; H03K 19/1774; H03K 19/1778; H03K 17/687; H03K 19/0948; H03K 19/0016; H03K 19/17728; H03K 19/1773; G06F 17/5054; G06F 17/5068; G06F 17/5072; G06F 17/5081; G06F 1/10; H01L 2224/48227; H01L 2924/1305; H01L 2924/13091; H01L 2224/45099; H01L 27/0207; H01L 24/32; H01L 27/088; H01L 27/10894; H01L 27/11; H01L 45/146
USPC .................................................. 716/110–116
See application file for complete search history.

(56) References Cited

U.S. PATENT DOCUMENTS

| 5,831,980 | A | 11/1998 | Varma et al. |
| 8,629,548 | B1 * | 1/2014 | Andreev ............ G06F 1/10 |
| | | | 257/691 |
| 2001/0049813 | A1 * | 12/2001 | Chan ............ G06F 17/5068 |
| | | | 716/120 |
| 2003/0084418 | A1 | 5/2003 | Regan |
| 2004/0251501 | A1 * | 12/2004 | Catalasan ............ H01L 23/544 |
| | | | 257/355 |
| 2007/0143578 | A1 | 6/2007 | Horton et al. |
| 2010/0070942 | A1 * | 3/2010 | Madurawe ........ G06F 17/5068 |
| | | | 716/128 |
| 2010/0199252 | A1 | 8/2010 | Torvi et al. |

(Continued)

FOREIGN PATENT DOCUMENTS

| CN | 101228630 B | 10/2011 |
| KR | 10-2015-0068910 A | 6/2015 |
| TW | 200532454 A | 10/2005 |

*Primary Examiner* — Binh Tat
(74) *Attorney, Agent, or Firm* — Maschoff Brennan

(57) ABSTRACT

A cell layout, a cell layout library and a synthesizing method are disclosed. The cell layout includes a cell block and a tapping connector. The cell block has a pin. The pin being disposed at a Nth metal layer in the cell layout. The tapping connector is disposed at a (N+1)th metal layer and a (N+2)th metal layer and stacked above the pin of the cell block. The tapping connector is electrically connected to the pin and forms an equivalent tapping point of the pin of the cell block. N is a positive integer greater than or equal to 1.

20 Claims, 12 Drawing Sheets

(56) References Cited

U.S. PATENT DOCUMENTS

2015/0161319 A1\* 6/2015 Hsu .................... G06F 17/5077
716/123
2015/0171005 A1 6/2015 Chen et al.
2015/0269302 A1 9/2015 Katta et al.

\* cited by examiner

CELL LAYOUT OF SEMICONDUCTOR DEVICE

BACKGROUND

Many circuit cells (inverters, comparators, registers, memory cells, etc.) in a semiconductor circuit are required to operate in synchronized timing. In order to provide precise clock signals to these circuit cells synchronously, a routing distribution (also known as a clock tree) of clock signals should be well designed, so as to prevent Signal Electromagnetic (SEM) issues happened on pins of circuit cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
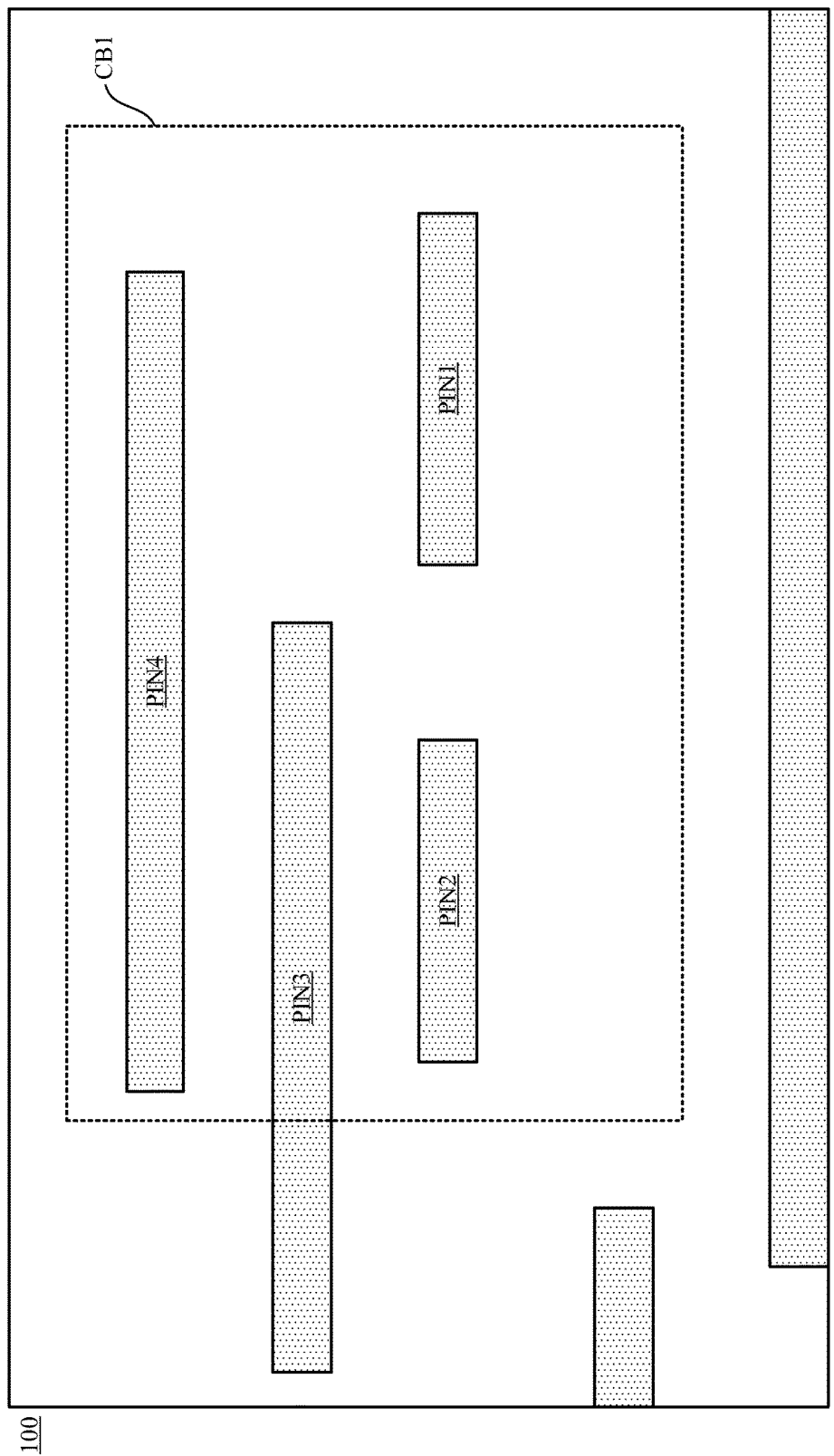
FIG. 1 is a top view diagram illustrating a cell layout of a semiconductor device.

FIG. 1 is a top view diagram illustrating a cell layout 100 of a semiconductor device. The cell layout 100 includes a cell block CB1 of the semiconductor device. In some embodiments, the cell block CB1 is a basic cell unit, including, for example, a transistor, a switch, a logic gate, a register, an inverter, a comparator, a clock buffer, etc., of the semiconductor device. Many cell blocks are implemented in one semiconductor device, and these basic cell blocks are linked together to perform some functions, including, for example, storing, adding, multiplying, comparing, etc. In some embodiments, the cell layout 100 shown in FIG. 1 is stored in a cell layout library and regarded as a standard cell layout.

In some embodiments, each of the cell blocks is configured to have some pins for transmitting signals. In the embodiments shown in FIG. 1, the cell block CB1 includes four pins PIN1, PIN2, PIN3 and PIN4. Among these four pins, the pin PIN1 is a clock-related pin. For illustration, the pin PIN1 is the clock input pin of the cell block CB1 for receiving a clock signal from a system clock generator (not shown in figures). The timing of the cell block CB1 is controlled by the pin PIN1, such that the cell block CB1 is synchronized with other cell blocks in the semiconductor device. In some embodiments, the other pins PIN2, PIN3 and PIN4 are each configured as one of a data input pin, a control signal input pin, an output pin and/or an enable pin depending on the functions of the cell block CB1. The amount of the pins of the cell block CB1 in FIG. 1 is given for illustrative purposes. Various amounts of the pins of the cell block CB1 are within the contemplated scope of the present disclosure.

In a cell layout as shown in FIG. 1, in some embodiments, the clock-related pin PIN1 is implemented on a lower metal layer in the cell layout 100 together with other pins PIN2~PIN4. For illustration, the clock-related pin PIN1 is implemented on the 1st metal layer (i.e., M1 layer).

In order to make sure synchronization of different cell blocks, a clock tree is usually implemented to distribute the clock signals in the same timing to each of the cell blocks. During the clock tree spanning, a clock-trunk of the clock tree is globally routed first, and some clock buffers are placed at different locations on the clock tree for boosting the clock signals. Afterwards, the layers and tracks are assigned for clock-leaf connection. At last, detail routings are assigned for clock-leaf connections between the clock-leaf and the clock pins of all cell blocks.

In typical circuit design, circuit components are arranged in an automatic synthesis process assisted by electronic design automatic (EDA) tools to optimize space and/or circuit performance. However, current EDA tools have poor control on routing patterns (especially on lower metal layers) and may induce many SEM issues or failures in design rule check (DRC) while clock routing. Leaf wirings of the clock routing established by the EDA tools may occupy unnecessary resource (e.g., routing space on the layout) and significantly impact signal routability during the synthesis process.

In the cell layout 100 shown in FIG. 1, the pin PIN1 of the cell block CB1 is a tapping point of the clock signal. The clock signal from the clock tree is connected to the pin PIN1 in the cell block CB1. However, the lower metal layers (e.g., M1 layer and M2 layer) in the cell layout 100 are usually occupied by many signal wirings. When the clock-leaf connections between the clock-leaf and the clock pins of all cell blocks are generated automatically by Electronic Design Automation (EDA) tools, the clock-leaf connections usually adopt a narrow signal wiring, or the clock-leaf connections might be overlapped with (or adjacent to) many other signals wiring. These clock-leaf connections will be failed in a design rule check (DRC) or a signal electromagnetic (SEM) simulation test because the clock signal transmitted over the clock-leaf connections tends to be affected by other signals.

Figure 2:
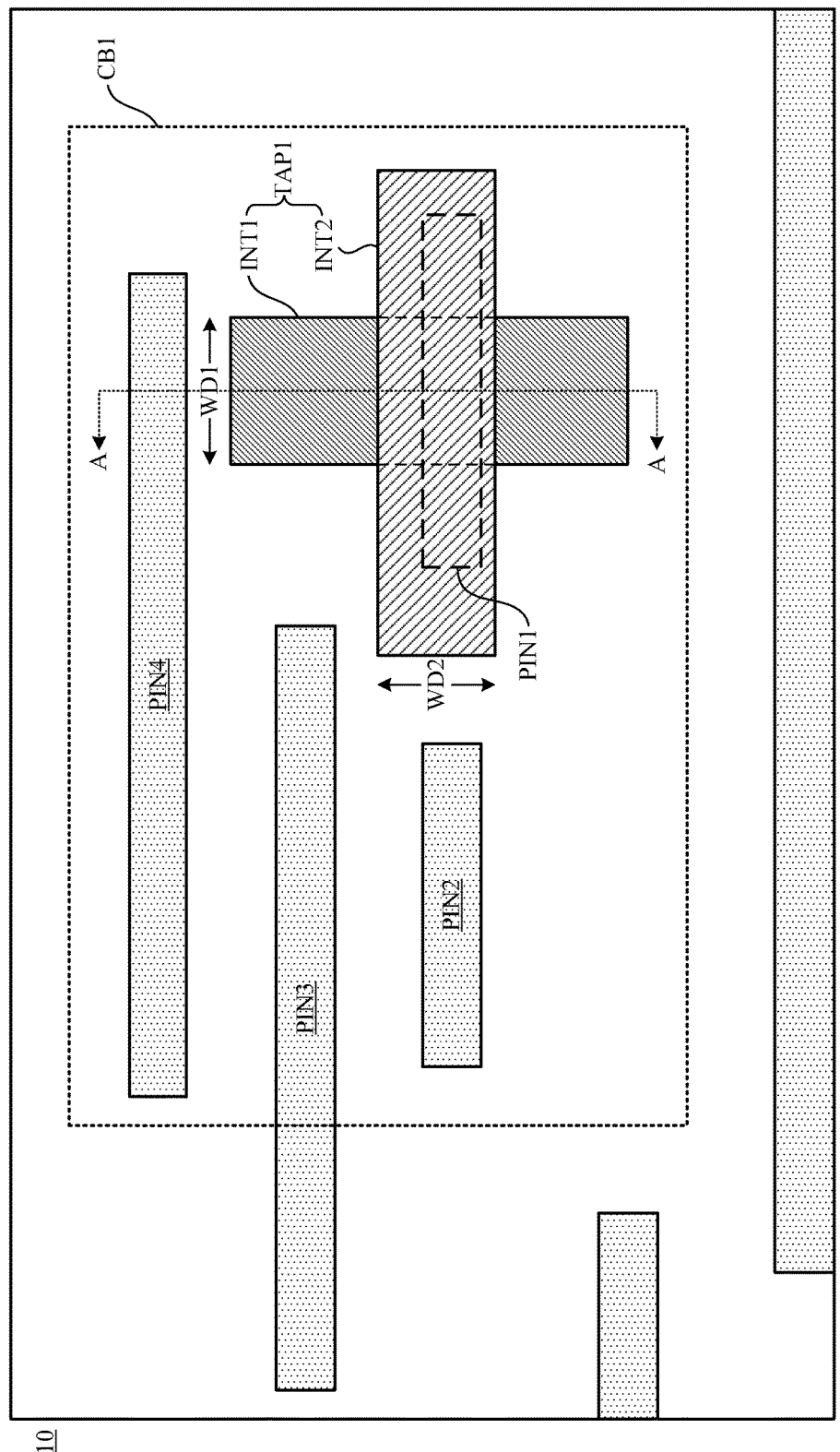
FIG. 2 is a top view diagram illustrating a cell layout of a semiconductor device according to an embodiment of the disclosure.
Figure 3:
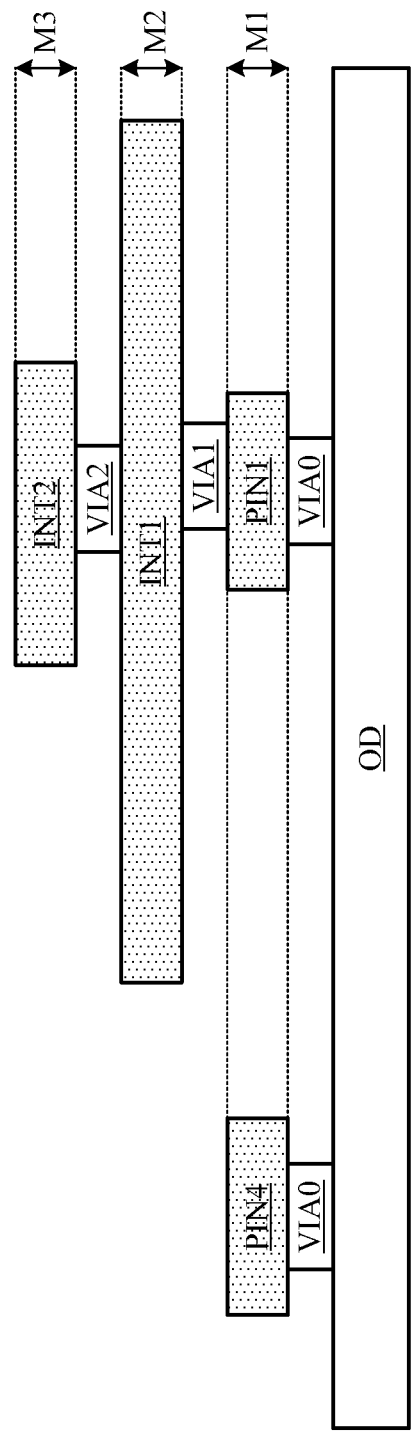
FIG. 3 is a sectional view diagram illustrating the cell layout along a sectional line A-A shown in FIG. 2.

Reference is made to FIG. 2 and FIG. 3. FIG. 2 is a top view diagram illustrating a cell layout 110 of a semiconductor device according to some embodiments of the present disclosure. FIG. 3 is a sectional view diagram illustrating the cell layout 110 along a sectional line A-A shown in FIG. 2, according to some embodiments of the present disclosure. As shown in FIG. 2, the cell layout 110 includes the cell block CB1 and a tapping connector TAP1.

The cell block CB1 includes a clock-related pin PIN1. The clock-related pin PIN1 is disposed at an Nth metal layer in the cell layout 110. In some embodiments, N is an integer greater than or equal to 0. In some embodiments, the tapping connector TAP1 is disposed, for illustration, at a (N+1)th metal layer and a (N+2)th metal layer, and the tapping connector TAP1 is stacked above the clock-related pin PIN1 of the cell block CB1.

The tapping connector TAP1 is electrically connected to the clock-related pin PIN1 and forms an equivalent tapping point of the clock-related pin PIN1 of the cell block CB1, such that the routing of the clock tree will be easier (not required to find out a path to the clock-related pin PIN1 in the lower metal layer). As a result, the clock tree is able to tap to the cell block CB1 through the tapping connector TAP1 on a relatively higher metal layer on the (N+2)th metal layer. In some other embodiments, the tapping connector (not shown in figures) is disposed and stacked above at least one of non clock-related pins PIN2~PIN4 of the cell block CB1, and the tapping connector forms an equivalent tapping point of the non clock-related pin(s) PIN2~PIN4 of the cell block CB1.

In the embodiments shown in FIG. 3, the clock-related pin PIN1 is disposed at the 1st metal layer (i.e., the M1 layer). In some embodiments, N is an integer greater than or equal to 0. The clock-related pin PIN1 is electrically connected to an active layer OD of the semiconductor device through a connecting via VIA0. In some embodiments, the clock-related pin PIN1 is electrically connected to an active layer OD of the semiconductor device through a contact (not shown). In some embodiments, the clock-related pin PIN1 is electrically connected to a POLY or a gate layer (not shown) of the semiconductor device through a contact (not shown) or a via. The tapping connector TAP1 includes a first metal interconnect INT1 and a second metal interconnect INT2. For illustration purpose, the tapping connector TAP1 only includes two metal interconnects in two metal layers, it is understood that the tapping connector TAP1 may include J numbers of metal interconnects in K numbers of metal layers, wherein the J, K are integer numbers and are larger than or equal to 1. In some embodiments, J is equal to K. In some embodiments, J is larger than K.

As shown in FIG. 2 and FIG. 3, the first metal interconnect INT1 is disposed at the (N+1)th metal layer (i.e., the 2nd metal layer, M2) and stacked over the clock-related pin PIN1 of the cell block CB1. The first metal interconnect INT1 is electrically connected to the clock-related pin PIN1 through another connecting via VIA1.

The second metal interconnect INT2 is disposed at the (N+2)th metal layer (i.e., the 3rd metal layer, M3) and stacked over the first metal interconnect INT1. The second metal interconnect INT2 is electrically connected to the first metal interconnect INT1 through another connecting via VIA2. The second metal interconnect INT2 forms the equivalent tapping point of the clock-related pin PIN1 of the cell block CB1. The clock tree is able to tap on the second metal interconnect INT2 instead of directly connecting to the clock-related pin PIN1 of the cell block CB1. Compared to some approaches without tapping connector TAP1, it is easier for clock tree spanning to connect the clock-leaf to the equivalent tapping point, for example, the second metal interconnect INT2 on the M3 layer in FIG. 3.

In some embodiments, in FIG. 2, a width WD1 of the first metal interconnect INT1 is 1 to 3 times as wide as a minimum trace width on the M2 layer in FIG. 3, according to design rules. A width WD2 of the second metal interconnect INT2 is 1 to 3 times the minimum trace width on the M3 layer according to the design rules.

When the width WD1 or the width WD2 is decreased, the current density over the first metal interconnect INT1 or the second metal interconnect INT2 will be increased, and the clock signal transmitted over the first metal interconnect INT1 and the second metal interconnect INT2 will be affected by SEM noises and face DRC issues.

When the width WD1 or the width WD2 is increased, the current density over the first metal interconnect INT1 or the second metal interconnect INT2 will be reduced, and it will prevent the SEM noises and DRC issues.

In some embodiments, the width WD1 is assigned to be around 2 times as wide as a minimum trace width on the M2 layer, and the width WD2 is assigned to be around 2 times as wide as a minimum trace width on the M3 layer. The minimum trace width on the M2/M3 layer is decided by a manufacturing rule or the design rules depending on different scales of manufacturing process. For example, the minimum trace width on the M2 layer is about 32 nanometer (nm) and the minimum trace width on the M3 layer is about 38 nanometer (nm) under the 16 nm manufacturing process.

As the embodiments shown in FIG. 2, the first metal interconnect INT1 and the second metal interconnect INT2 are widened interconnects, which, in some embodiments, have widths that are 2 times as wide as the minimum trace width on corresponding layers, such that the SEM noise will be reduced on the first metal interconnect INT1 and the second metal interconnect INT2, and the widths of the first metal interconnect INT1 and the second metal interconnect INT2 will meet the width requirements defined in the design rules.

In some embodiments, the width WD2 is 0.5 to 3 times as wide as the width WD1. In some embodiments, to balance the tradeoff between DRC/SEM issues and routing resources, the width WD2 is assigned to be 0.6 to 0.67 times as wide as the width WD1.

For illustration, the cell layout 110, when the width WD2 is assigned to be 0.6 to 0.67 times as wide as the width WD1, has less DRC failures and more SEM benefits, compared to that the width WD2 is assigned to be, for example, 0.5 to 0.6 times, as wide as the width WD1. On the other hand, the cell layout 110, when the width WD2 is assigned to be 0.6 to 0.67 times as wide as the width WD1, has SEM benefits and is able to pass DRC without sacrificing too much routing resources, compared to that the width WD2 is assigned to be, for example, 0.67 to 3 times, as wide as the width WD1.

The cell layout 110, which includes the cell block CB1 together with the tapping connector TAP1 shown in FIG. 2 and FIG. 3, is stored in the cell layout library beside the cell layout 100 shown in FIG. 1. The cell layout 110 regarded as a substitute cell layout corresponding to the standard cell layout (i.e., the cell layout 100 shown in FIG. 1).

In response to that the standard cell layout (e.g., the cell layout 100) adopted in a synthesis process fails in a design rule check (DRC) or a signal electromagnetic (SEM) simulation test, the substitute cell layout (e.g., the cell layout 110) is utilized to replace the standard cell layout in the synthesis process.

In aforesaid embodiments, the cell block CB1 is a sequential cell (e.g., the cell block utilized as the transistor, logic gates or inverter). In the sequential cell, only one pin is clock-related pin. However, in some specific cell, there are multiple clock-related pins existed in one cell block. For example, the input pin and the output pin of a clock buffer are both clock-related pin.

Figure 4:
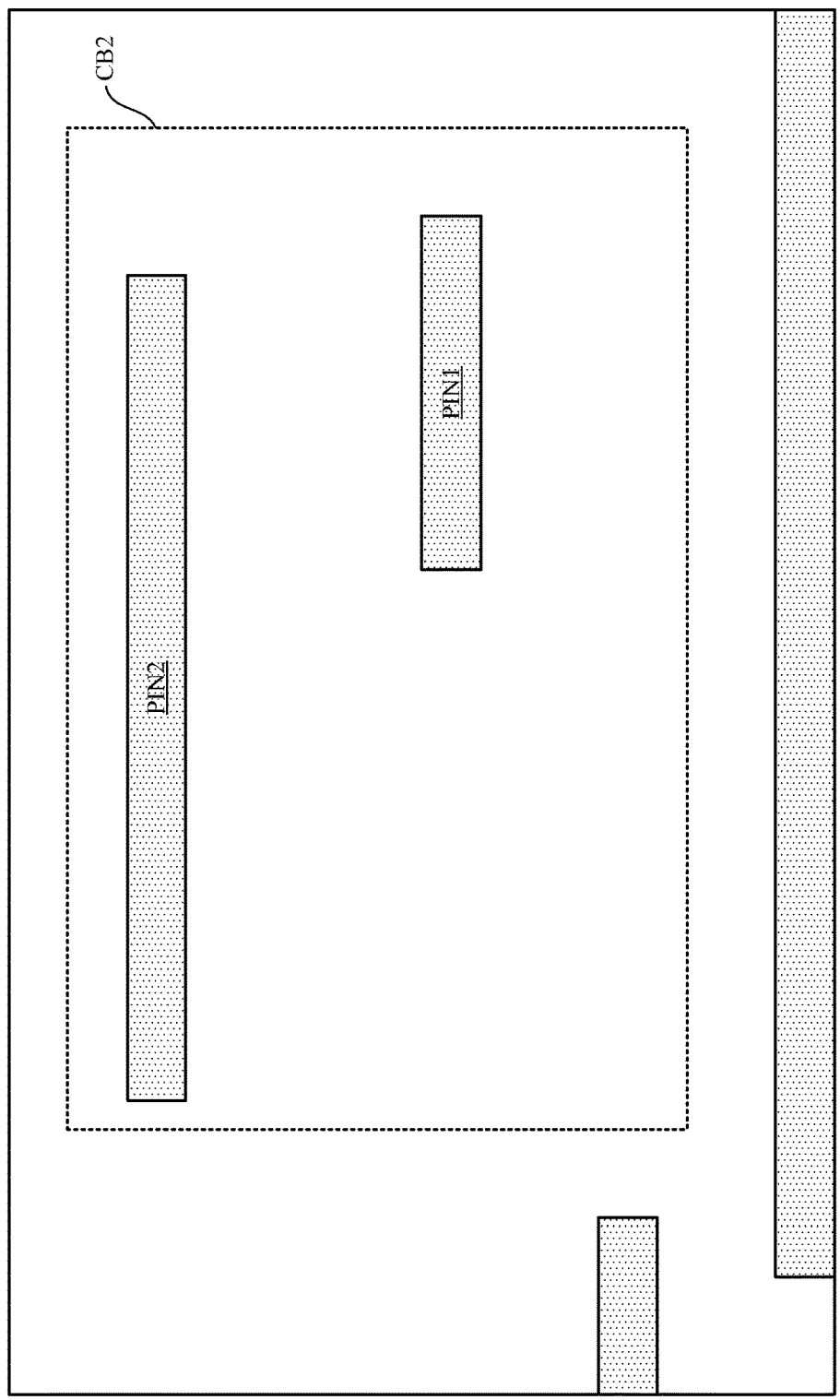
FIG. 4 is a top view diagram illustrating another cell layout of a semiconductor device according to an embodiment of the disclosure.
Figure 5:
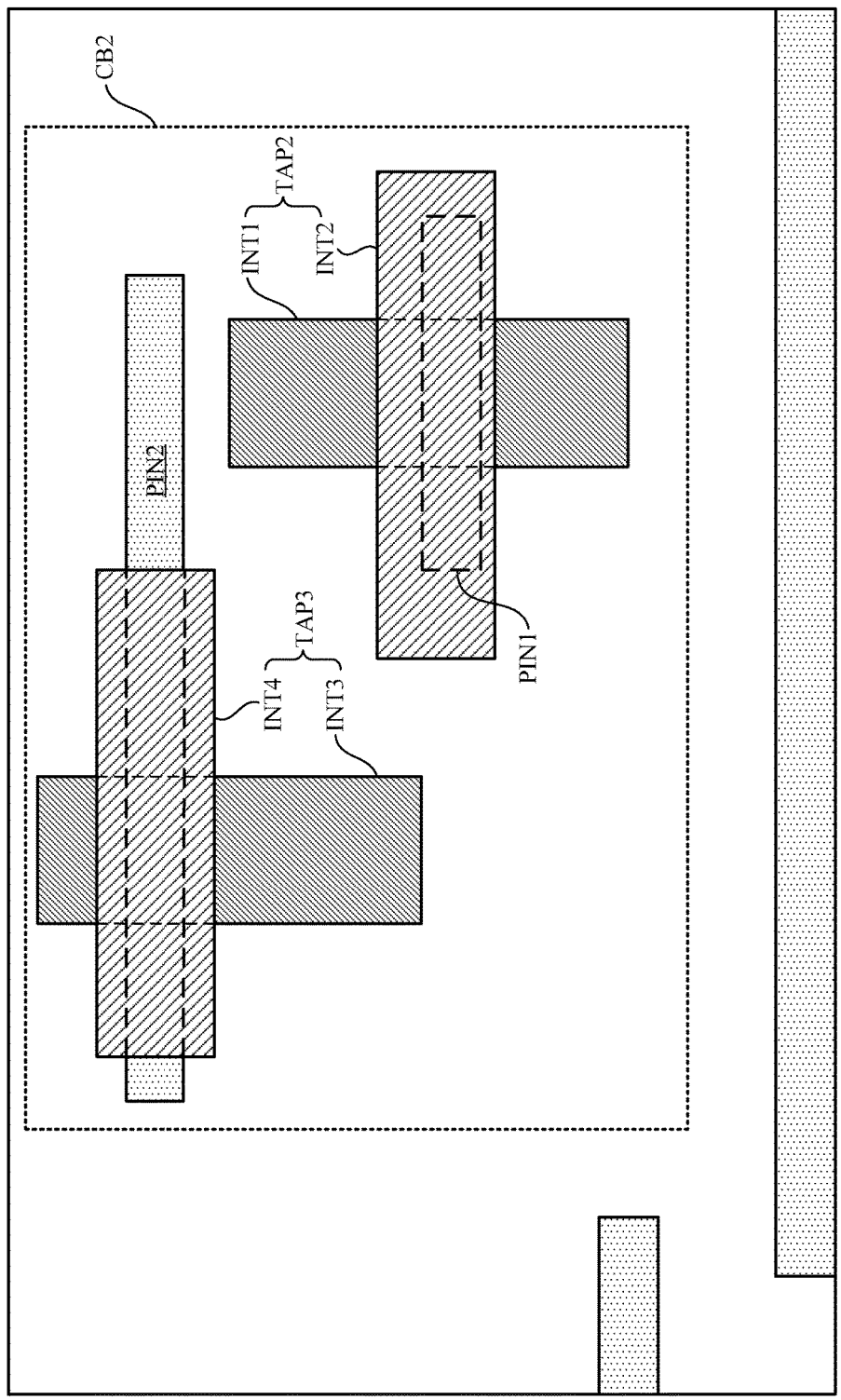
FIG. 5 is a top view diagram illustrating another cell layout with tapping connectors of a semiconductor device according to an embodiment of the disclosure.

Reference is also made to FIG. 4 and FIG. 5. FIG. 4 is a top view diagram illustrating another cell layout 200 of a semiconductor device according to an embodiment of the disclosure. FIG. 5 is a top view diagram illustrating another cell layout 210 with tapping connectors TAP2-TAP3 of a semiconductor device according to an embodiment of the disclosure.

The cell block CB2 of the cell layout 200 shown in FIG. 4 has two pins PIN1 and PIN2. In the embodiment, the pins PIN1 and PIN2 of the cell block CB2 are both clock-related pins.

In the cell layout 210 shown in FIG. 5, there are two tapping connectors TAP2 and TAP3 stacked over the clock-related pins PIN1 and PIN2 of the cell block CB2. The tapping connector TAP2 includes a first metal interconnect INT1 and a second metal interconnect INT2. The tapping connector TAP3 includes a third metal interconnect INT3 and a fourth metal interconnect INT4. Details about the first metal interconnect INT1 and the second metal interconnect INT2 of the tapping connector TAP2 and the third metal interconnect INT3 and the fourth metal interconnect INT4 of the tapping connector TAP3 are referred to the descriptions of the tapping connector TAP1 in aforesaid embodiment, and not to be repeated here.

In some embodiments, the size of the first metal interconnect INT1 is similar to the size of the third metal interconnect INT3, and the size of the second metal interconnect INT2 is similar to the size of the fourth metal interconnect INT4.

For simplicity of illustration, INT2/INT1 indicates a ratio of the size of the second metal interconnect INT2 to the size of the first metal interconnect INT1, and INT4/INT3 indicates a ratio of the size of the fourth metal interconnect INT4 to the size of the third metal interconnect INT3. In various embodiments, INT4/INT3 is larger than INT2/INT1. In alternative embodiments, INT4/INT3 ranges between (INT2/INT1)/2 and (INT2/INT1)*2.

In some embodiment, a width of the second metal interconnect INT2 is 0.5 to 3 times as wide as a width of the first metal interconnect INT1. In some embodiments, the width of the second metal interconnect INT2 is assigned to be 0.6 to 0.67 times as wide as the width of the first metal interconnect INT1.

In some embodiment, a width of the second metal interconnect INT4 is 0.5 to 3 times as wide as a width of the first metal interconnect INT3. In some embodiments, the width of the second metal interconnect INT4 is assigned to be 0.6 to 0.67 times as wide as the width of the first metal interconnect INT3.

For illustration purpose, the tapping connector TAP2/TAP3 only includes two metal interconnects in two metal layers, it is understood that the tapping connector TAP2/TAP3 may include J numbers of metal interconnects in K numbers of metal layers, wherein the J, K is integer numbers and is larger than or equal to 1. In some embodiments, J is equal to K. In some embodiments, J is larger than K.

In some embodiments, the cell layout 200 is stored in the cell layout as a standard cell layout. The cell layout 210, which includes the cell block CB2 together with the tapping connectors TAP1-TAP2 shown in FIG. 5, is stored in the cell layout library beside the cell layout 200 shown in FIG. 4. The cell layout 210 regarded as a substitute cell layout corresponding to the standard cell layout (i.e., the cell layout 200 shown in FIG. 4).

Aforesaid embodiments in FIGS. 2-5 have disclosed a cell layout including the tapping connector. In some examples, the tapping connector includes widened metal interconnects stacked on one or more clock-related pins in the cell block. The widened metal interconnects reduce the current density of a bypassing signal (e.g., a clock signal), and reduce the risk to fail in DRC. The cell layout in the embodiment reduces a complexity of routing pattern at lower-layer is reduced, and also reduce the SEM impact from other wirings to the clock-related pin.

Figure 6:
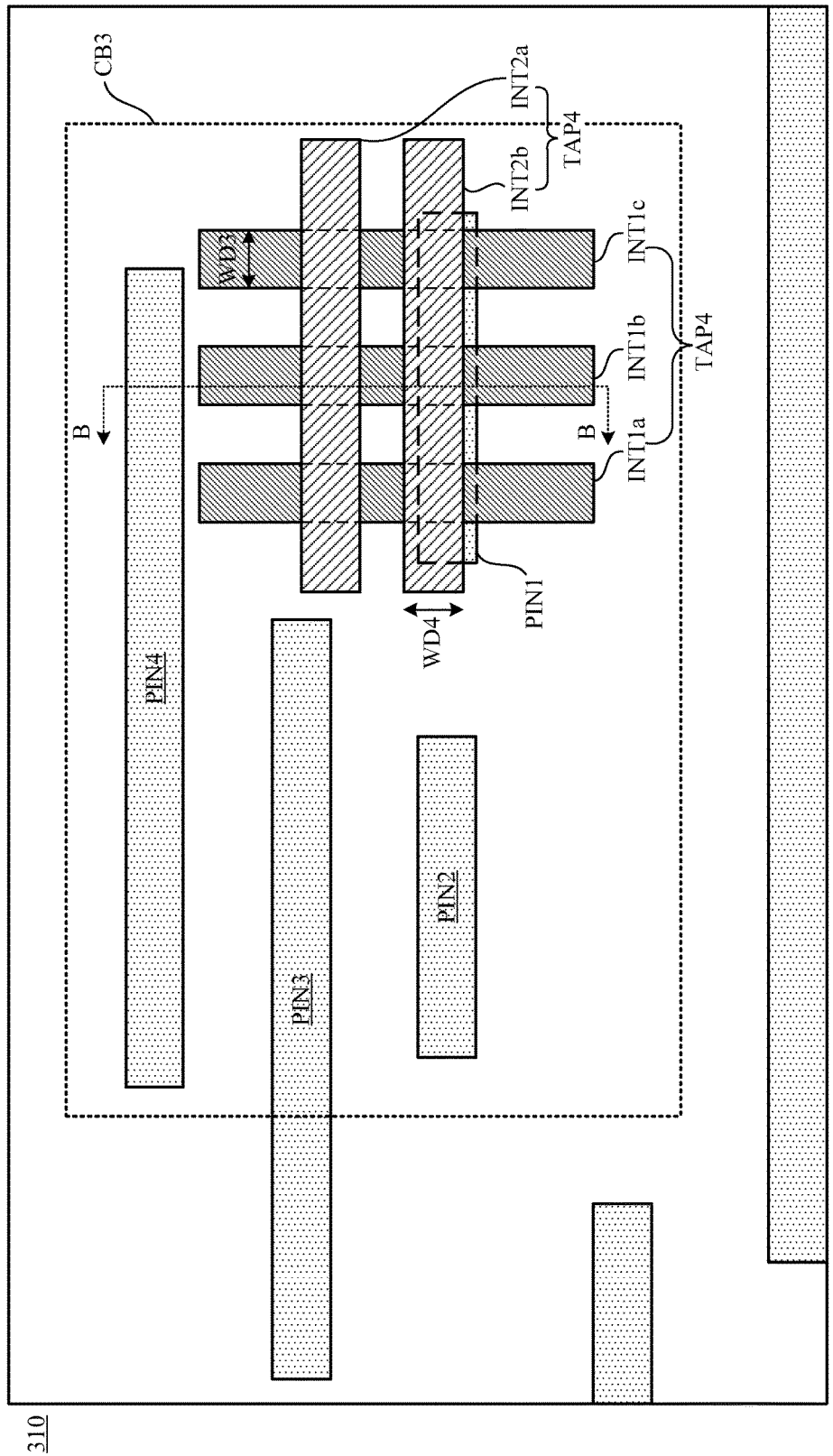
FIG. 6 is a top view diagram illustrating a cell layout of a semiconductor device according to an embodiment of the disclosure.
Figure 7:
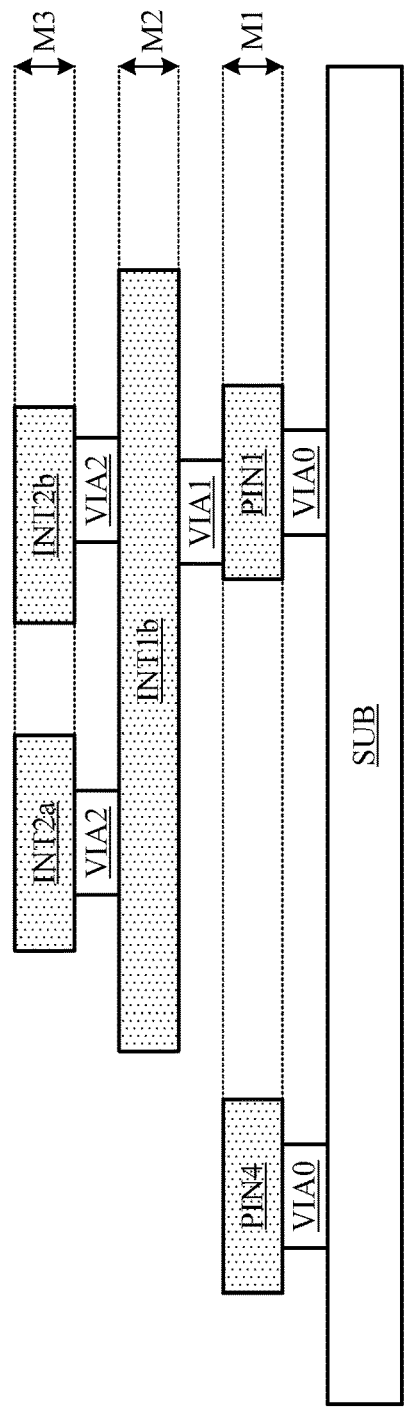
FIG. 7 is a sectional view diagram illustrating the cell layout along a sectional line B-B shown in FIG. 6.

Reference is made to FIG. 6 and FIG. 7. FIG. 6 is a top view diagram illustrating a cell layout 310 of a semiconductor device according to an embodiment of the disclosure. FIG. 7 is a sectional view diagram illustrating the cell layout 310 along a sectional line B-B shown in FIG. 6. The cell layout 310 disclosed in FIG. 6 demonstrates another example of a substitute cell layout corresponding to the cell layout 100 (the standard cell layout) shown in FIG. 1.

As shown in FIG. 6, the cell layout 310 includes a cell block CB3 and a tapping connector TAP4. The cell block CB3 includes a clock-related pin PIN1 and other pins PIN2-PIN4. The clock-related pin PIN1 and the other pins PIN2-PIN4 are disposed at the Nth metal layer in the cell layout 310. In some embodiments, N is equal to 1, and the clock-related pin PIN1 is disposed at the 1st metal layer (M1). In some other embodiments, N is an integer greater than or equal to 0.

As shown in FIG. 6 and FIG. 7, the tapping connector TAP4 is disposed at the (N+1)th metal layer (the 2nd metal layer, M2) and a (N+2)th metal layer (the 3rd metal layer, M3). The tapping connector TAP4 is stacked above the clock-related pin PIN1 of the cell block CB3. The tapping connector TAP4 is electrically connected to the clock-related pin PIN1 and forms an equivalent tapping point of the clock-related pin PIN1 of the cell block CB3. In some embodiments, the tapping connector TAP4 may be electrically connected to the pins other than the clock-related pin.

For illustration purpose, the tapping connector TAP4 only includes two metal interconnects in two metal layers, it is understood that the tapping connector TAP4 may include J numbers of metal interconnects in K numbers of metal layers, wherein the J, K is integer numbers and is larger than or equal to 1. In some embodiments, J is equal to K. In some embodiments, J is larger than K.

The tapping connector TAP4 includes a plurality of first metal interconnects and a plurality of second metal interconnects. In the embodiment shown in FIG. 6 and FIG. 7, there are three first metal interconnects INT1a-INT1c and two second metal interconnects INT2a-INT2b in the tapping connector TAP4. For illustration, the first metal interconnects INT1a-INT1c and two second metal interconnects INT2a-INT2b form a 3*2 interconnect-mesh. FIG. 6 and FIG. 7 show only three first metal interconnects INT1a-INT1c and two second metal interconnects INT2a-INT2b, but they are given for illustrative purposes. Various numbers of the first/second metal interconnects are within the contemplated scope of the present disclosure. In some embodiments, the interconnect-mesh is an A*B mesh. Each of A and B is a positive integer greater than or equal to 1.

The first metal interconnects INT1a-INT1c are disposed at the 2nd metal layer (M2). The first metal interconnects INT1a-INT1c are parallel to each other. At least one of first metal interconnects INT1a-INT1c is stacked over the clock-related pin PIN1 and is electrically connected to the clock-related pin PIN1 through a connecting via VIA1.

The second metal interconnects INT2a-INT2b are disposed at the 3rd metal layer (M3). The second metal interconnects INT2a-INT2b are parallel to each other. The second metal interconnects INT2a-INT2b are stacked over the first metal interconnects INT1a-INT1c. The second metal interconnects INT2a-INT2b are disposed to be perpendicular to the first metal interconnects INT1a-INT1c, such that the first metal interconnects INT1a-INT1c and the second metal interconnects INT2a-INT2b forms the 3*2 mesh. The second metal interconnects INT2a-INT2b are electrically connected to the first metal interconnects INT1a-INT1c through connecting vias VIA2. The second metal interconnects INT2a-INT2b form the equivalent tapping point of the clock-related pin PIN1 of the cell block CB3.

Aforesaid embodiments in FIG. 6 and FIG. 7 disclose a cell layout including the tapping connector. In some embodiments, the tapping connector includes a metal interconnect-mesh stacked on one or more clock-related pins in the cell block. The metal interconnect-mesh reduces the current density of a bypassing signal (e.g., a clock signal), and reduces the risk to fail in DRC. The clock-related pin in the cell layout originally at a lower metal layer is pre-stacked through the tapping connector to a higher metal layer, such that a complexity of routing pattern at lower-layer is reduced in the cell layout. The tapping connector is formed by a widened metal interconnect or a metal interconnect-mesh, such that a bypass current will not congest in a narrow path along the routing pattern. Accordingly, the clock signal is transmitted to the clock-related pin through the tapping connector, instead of being transmitted through a narrow path. As a result, SEM impact from other surrounding wirings is avoided.

In addition, when the cell block CB3 includes more than one clock-related pin (not shown in figures), an additional metal interconnect-mesh (i.e., the tapping connector TAP4) is implemented on other clock-related pin(s). The details can be referred to the embodiment disclosed in FIG. 5, in which the cell block 210 includes multiple clock-related pins and multiple tapping connectors.

In some embodiments, a width WD3 of each of the first metal interconnect INT1a-INT1c is longer than the minimum trace width on the M2 layer according to design rules, and a width WD4 of each of the second metal interconnect INT2a-INT2b is longer than a minimum trace width on the M3 layer according to the design rules.

In some embodiments, the width WD3 is as Q times width as the width WD4. In some embodiments, Q is a positive value from, for example, 0.7 to 1.5. In some other embodiment, Q is a positive value from, for example, 0.85 to 0.9.

In some embodiments, the width WD3 of each of the first metal interconnect INT1a-INT1c is similar to the width WD4 of each of the second metal interconnect INT2a-INT2b.

In some other embodiments, the width WD3 of each of the first metal interconnect INT1a-INT1c is different from the width WD4 of each of the second metal interconnect INT2a-INT2b.

Figure 8:
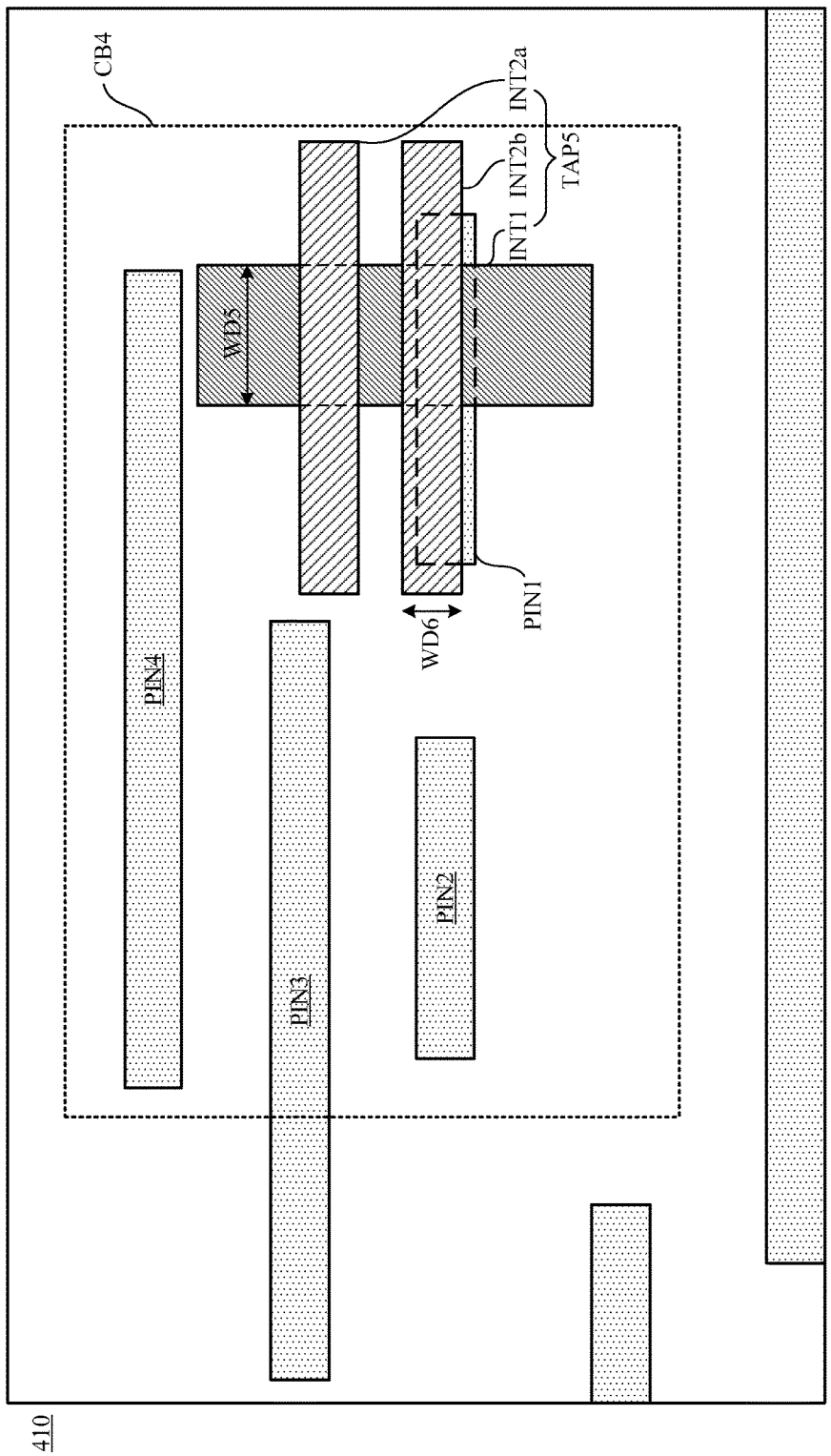
FIG. 8 is a top view diagram illustrating a cell layout of a semiconductor device according to an embodiment of the disclosure.

Reference is made to FIG. 8. FIG. 8 is a top view diagram illustrating a cell layout 410 of a semiconductor device according to an embodiment of the disclosure. The cell layout 410 disclosed in FIG. 8 demonstrates another embodiment of a substitute cell layout corresponding to the cell layout 100 (the standard cell layout) shown in FIG. 1.

The cell layout 410 includes a cell block CB4 and a tapping connector TAP5. The cell block CB4 includes a clock-related pin PIN1 and other pins PIN2-PIN4. The clock-related pin PIN1 and the other pins PIN2-PIN4 are disposed at the Nth metal layer in the cell layout 410. In some embodiments, N is equal to 1, and the clock-related pin PIN1 is disposed at the 1st metal layer (M1). In some embodiments, N is an integer greater than or equal to 0.

For illustration purpose, the tapping connector TAP5 only includes two metal interconnects in two metal layers, it is understood that the tapping connector TAP5 may include J numbers of metal interconnects in K numbers of metal layers, wherein the J, K is integer numbers and is larger than or equal to 1. In some embodiments, J is equal to K. In some embodiments, J is larger than K.

The tapping connector TAP5 is a combination of embodiments illustrated in FIG. 5 and FIG. 6. The tapping connector TAP5 includes a first metal interconnect INT1 and a plurality of second metal interconnects INT2a-INT2b. The first metal interconnect INT1 is disposed at the 2nd metal layer (M2) and stacked over the clock-related pin PIN1. The first metal interconnect INT1 is electrically connected to the clock-related pin PIN1.

The second metal interconnects INT2a-INT2b are disposed at the 3rd metal layer (M3). The second metal interconnects INT2a-INT2b are parallel to each other. The second metal interconnects INT2a-INT2b are stacked over and disposed to be perpendicular to the first metal interconnect INT1. The second metal interconnects INT2a-INT2b are electrically connected to the first metal interconnect INT1. The second metal interconnects INT2a-INT2b form the equivalent tapping point of the clock-related pin PIN1 of the cell block CB4.

In some embodiments, a width WD5 of the first metal interconnect is 1 to 3 times as wide as a minimum trace width on the 2nd metal layer according to design rules, and a width WD6 of each of the second metal interconnects INT2a-INT2b is longer than a minimum trace width on the 3rd metal layer according to the design rules.

In some embodiments, the width WD5 of the first metal interconnect INT1 is different from the width WD6 of each of the second metal interconnect INT2a-INT2b.

In some embodiments, the width WD5 is as R times width as the width WD6. In some embodiments, R is a positive value from, for example, 1.5 to 5. In some other embodiments, R is a positive value from, for example, 1.7 to 2.7.

Figure 9:
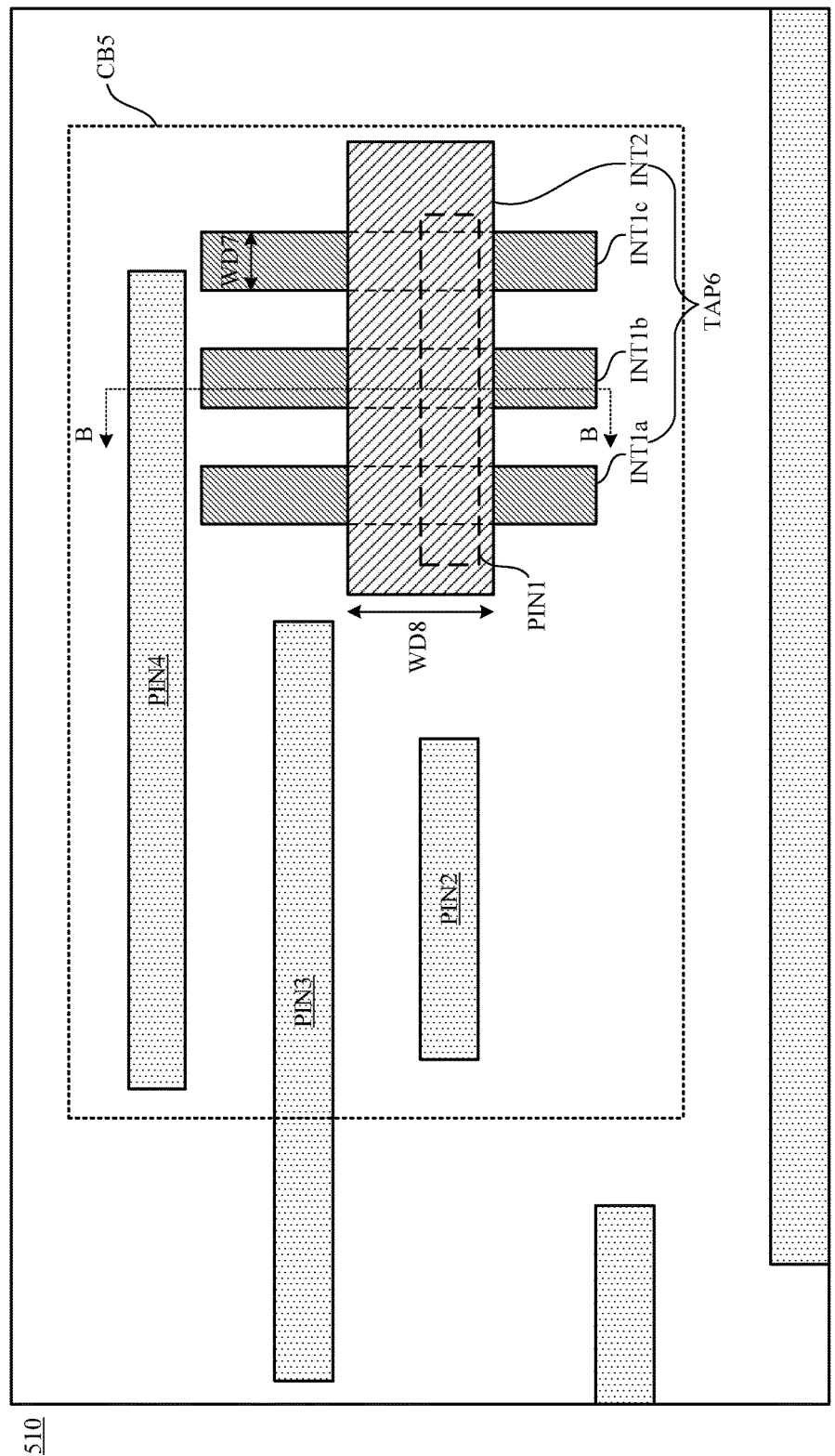
FIG. 9 is a top view diagram illustrating a cell layout of a semiconductor device according to an embodiment of the disclosure.

Reference is made to FIG. 9. FIG. 9 is a top view diagram illustrating a cell layout 510 of a semiconductor device according to an embodiment of the disclosure. The cell layout 510 disclosed in FIG. 9 demonstrates various embodiments of a substitute cell layout corresponding to the cell layout 100 (the standard cell layout) shown in FIG. 1.

The cell layout 510 includes a cell block CB5 and a tapping connector TAP6. The cell block CB5 includes a clock-related pin PIN1 and other pins PIN2-PIN4. The clock-related pin PIN1 and the other pins PIN2-PIN4 are disposed at the Nth metal layer in the cell layout 510. In some embodiments, N is equal to 1, and the clock-related pin PIN1 is disposed at the 1st metal layer (M1). In some embodiments, N is an integer greater than or equal to 0.

For illustration purpose, the tapping connector TAP5 only includes two metal interconnects in two metal layers, it is understood that the tapping connector TAP5 may include J numbers of metal interconnects in K numbers of metal layers, wherein the J, K is integer numbers and is larger than or equal to 1. In some embodiments, J is equal to K. In some embodiments, J is larger than K.

The tapping connector TAP6 is a combination of embodiments illustrated in FIG. 5 and FIG. 6. The tapping connector TAP6 includes a plurality of first metal interconnects INT1a-INT1c and a second metal interconnect INT2. The first metal interconnects INT1a-INT1c are disposed at the 2nd metal layer. The first metal interconnects INT1a-INT1c are parallel to each others. At least one of first metal interconnects INT1a-INT1c are stacked over the clock-related pin PIN1 and electrically connected to the clock-related pin PIN1.

The second metal interconnect INT2 is disposed at the 3rd metal layer and stacked over the first metal interconnects INT1a-INT1c. The second metal interconnect INT2 is electrically connected to the first metal interconnects INT1a-INT1c, and the second metal interconnect INT2 forms an equivalent tapping point of the clock-related pin PIN1 of the cell block CB5.

In some embodiments, a width WD7 of each of the first metal interconnects INT1a-INT1c is longer than a minimum trace width on the 2nd metal layer according to the design rules, and a width WD8 of the second metal interconnect INT2 is 1 to 3 times as wide as a minimum trace width on the 3rd metal layer according to design rules.

In some embodiments, the width WD7 of each of the first metal interconnects INT1a-INT1c is different from the width WD8 of the second metal interconnect INT2.

In some embodiments, the width WD7 is as T times width as the width WD8. In some embodiments, T is a positive value from 0.3 to 0.7. In some other embodiments, T is a positive value from 0.33 to 0.55.

Figure 10B:
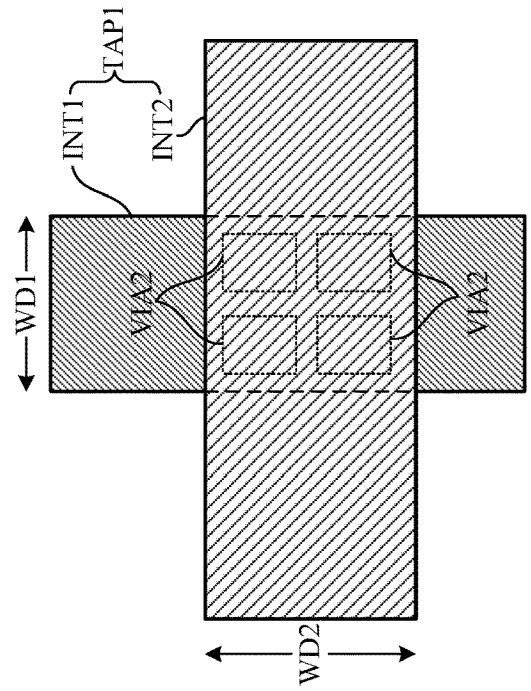
FIG. 10B is a top view diagram illustrating still another embodiments of the connecting via between the first metal interconnect and the second metal interconnect.
Figure 10A:
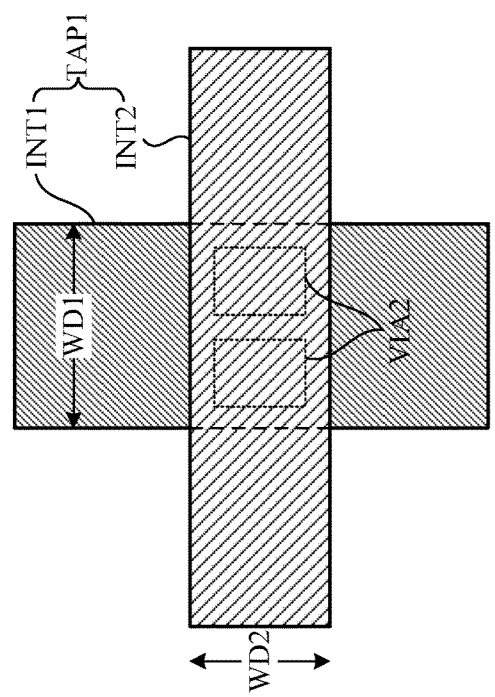
FIG. 10A is a top view diagram illustrating another embodiments of the connecting via between the first metal interconnect and the second metal interconnect.

In aforesaid embodiments, the connecting via VIA2 between the first metal interconnect INT1 and the second metal interconnect INT2 shown in FIG. 3 is formed in one piece. Reference is made to FIG. 10A and FIG. 10B. FIG. 10A is a top view diagram illustrating another embodiments of the connecting via between the first metal interconnect INT1 and the second metal interconnect INT2. FIG. 10B is a top view diagram illustrating still another embodiments of the connecting via between the first metal interconnect INT1 and the second metal interconnect INT2.

As shown in FIG. 10A, the connecting via VIA2 between the first metal interconnect INT1 and the second metal interconnect INT2 includes a 1*2 via-array. The 1*2 via-array is formed by two separated vias between the first metal interconnect INT1 and the second metal interconnect INT2. The 1*2 via-array is suitable to reduce the SEM noise when the width WD2 of the second metal interconnect INT2 is assigned to be 0.6 to 0.67 times as wide as the width WD1 of the first metal interconnect INT1.

As shown in FIG. 10B, the connecting via VIA2 between the first metal interconnect INT1 and the second metal interconnect INT2 includes a 2*2 via-array. The 2*2 via-array is formed by four separated vias between the first metal interconnect INT1 and the second metal interconnect INT2. The 2*2 via-array is suitable to reduce the SEM noise when the width WD2 of the second metal interconnect INT2 is assigned to longer than the width WD1 of the first metal interconnect INT1.

Figure 11:
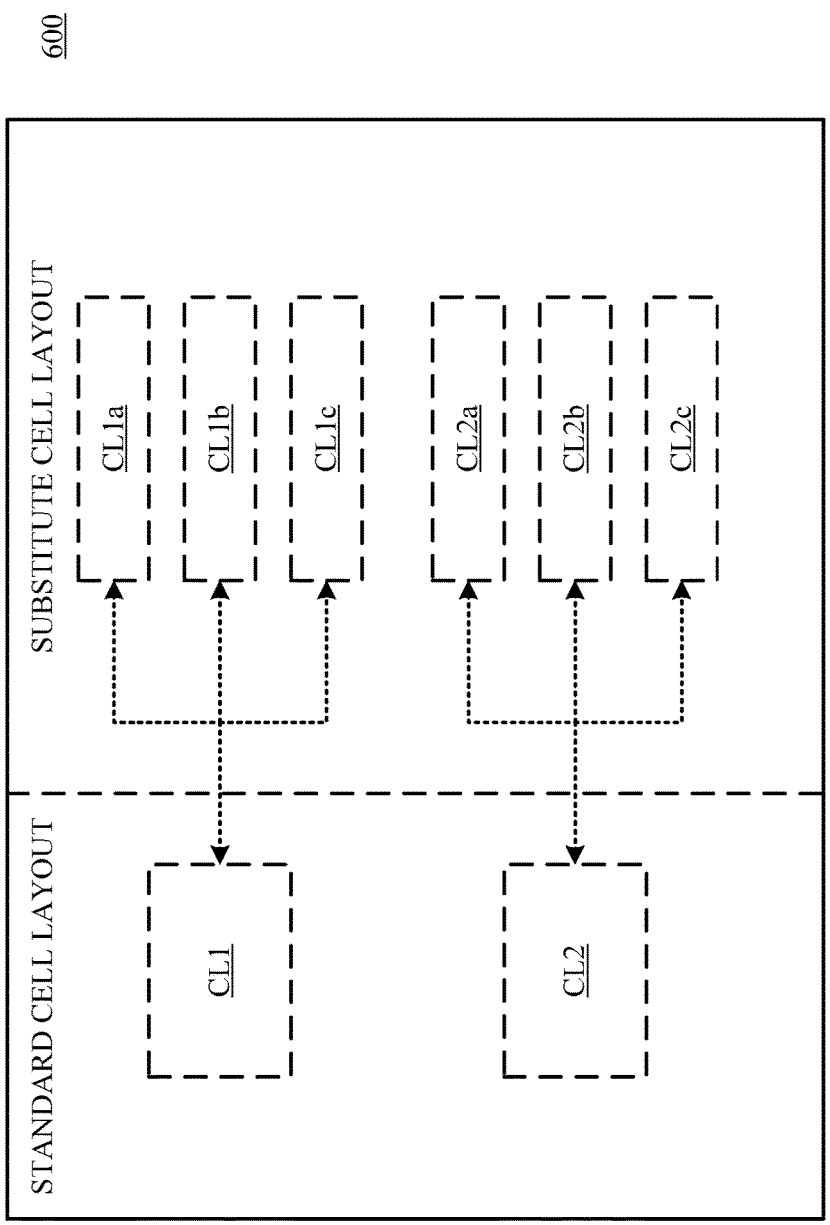
FIG. 11 is a schematic diagram illustrating a cell layout library stored on a non-transitory computer readable storage according to an embodiment of the disclosure.

Reference is made to FIG. 11, which is a schematic diagram illustrating a cell layout library 600 stored on a non-transitory computer readable storage according to an embodiment of the disclosure. The cell layout library 600 is associated with cell layouts for defining a layout design used by a processor for fabrication of at least one aspect of a semiconductor device. The cell layout library 600 includes standard cell layouts CL1-CL2 and substitute cell layouts CL1a-CL1c and CL2a-CL2c.

Each of the standard cell layouts (e.g., the cell layout 100 in FIG. 1 and the cell layout 200 in FIG. 4) includes a cell block having a clock-related pin.

Each of the substitute cell layouts CL1a-CL2c corresponds to one of the standard cell layout CL1-CL2. In the embodiment, the substitute cell layouts CL1a-CL1c corresponds to the standard cell layout CL1. The substitute cell layouts CL2a-CL2c corresponds to the standard cell layout CL2.

Each of the substitute cell layouts CL1a-CL2c includes a corresponding cell block and a tapping connector. The corresponding cell block is equivalent to the cell block of the standard cell layout. For illustration, the cell layout 110 in FIG. 2, the cell layout 310 in FIG. 6, the cell layout 410 in FIG. 8 and the cell layout 510 in FIG. 9 are substitute cell layouts corresponding to the cell layout 100 in FIG. 1. The cell layout 210 in FIG. 5 is a substitute cell layout corresponding to the cell layout 200 in FIG. 4.

The tapping connector is stacked above a clock-related pin of the corresponding cell block. The tapping connector forms an equivalent tapping point of the clock-related pin of the corresponding cell block. Details of the tapping connector are mentioned in aforesaid embodiments, and not to be repeated here again.

In response to that the standard cell layout adopted in a synthesis process fails in a design rule check (DRC) or a signal electromagnetic (SEM) simulation test, the substitute cell layout is utilized to replace the standard cell layout in the synthesis process. For illustration, if the cell layout 100 in FIG. 1 is adopted in a synthesis process and fails in a design rule check (DRC) or a signal electromagnetic (SEM) simulation test, one substitute cell layout selected from the cell layout 110 in FIG. 2, the cell layout 310 in FIG. 6, the cell layout 410 in FIG. 8 or the cell layout 510 in FIG. 9 is utilized to replace the cell layout 100 in FIG. 1. Then, the layout plan with the substitute cell layout will be entered to the synthesis process again. Because the substitute cell layout has the tapping connector pre-stacked on the clock-related pin, the layout plan with the substitute cell layout has a better chance to pass the design rule check (DRC) or the signal electromagnetic (SEM) simulation test. In some embodiments, the tapping connector is pre-stacked on non clock-related pin(s) of the cell layout.

In some embodiments, the tapping connector within one substitute cell layout is widened metal interconnects pre-stacked above the clock-related pin of the corresponding cell block (referring to the cell layout 110 in FIG. 2). A width of each widened metal interconnect is 1 to 3 times as wide as a minimum trace width on a corresponding metal layer according to design rules.

In some embodiments, the tapping connector within one substitute cell layout is an interconnect-mesh pre-stacked above the clock-related pin of the corresponding cell block (referring to the cell layout 310 in FIG. 6, the cell layout 410 in FIG. 8 or the cell layout 510 in FIG. 9). The interconnect-mesh includes a plurality of metal interconnects disposed on two different metal layers. The metal interconnects are electrically connected to each others.

Figure 12:
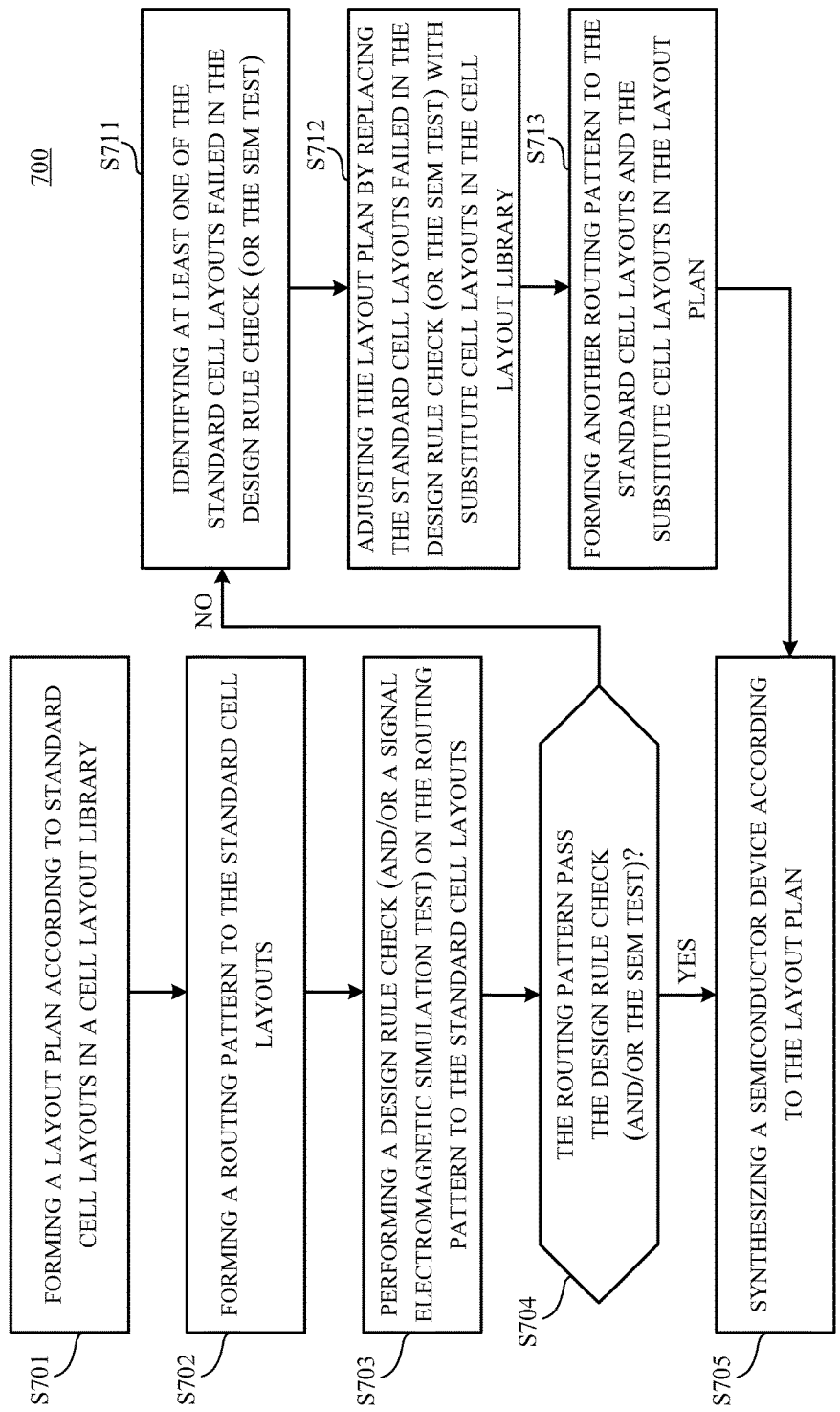
FIG. 12 is a flow chart illustrating a synthesis method according to an embodiment of the disclosure.

Reference is made to FIG. 12, which is a flow chart illustrating a synthesis method 700 according to an embodiment of the disclosure. The synthesis method 700 is suitable to synthesis a semiconductor device according to a cell layout library. The cell layout library includes standard cell layouts and corresponding substitute cell layouts (referring to the cell layout library 600 in FIG. 10).

Operation S701 of the synthesis method 700 is executed to plan the semiconductor device according to standard cell layouts in a cell layout library at the beginning.

Operation S702 of the synthesis method 700 is executed to form a routing pattern to the standard cell layouts. In some embodiments, the routing pattern includes clock routes and signal routes.

Operation S703 is executed to perform a design rule check (and/or a signal electromagnetic simulation test, SEM test) on the routing pattern, so as to check if a current congestion region exists in the layout plan (or if a narrow wiring existed in the layout plan).

Operation S704 is executed to determine whether at least one of the standard cell layouts passes the DRC and/or the SEM test. In some embodiments, one of the design rule check or the SEM test is performed to the layout plan in operation S703, and the operation S704 is executed to determine whether the layout plan passes the check/test or not. In other embodiments, both of the design rule check and the SEM test are performed to the layout plan in operation S703, and the operation S704 is executed to determine whether the layout plan passes both of them, or fails in either one of them.

If the standard cell layouts pass the DRC, operation S705 is executed to synthesize the semiconductor device according to the layout plan directly.

If at least one of the standard cell layouts is failed in the DRC (and/or the signal electromagnetic simulation test, SEM test), operations S711-S713 are executed. Operation 711 is executed to identify at least one of the standard cell layouts failed in the DRC (or SEM test). Operation 712 is executed to adjust the layout plan by replacing the standard cell layouts failed in the DRC (or SEM) with substitute cell layouts in the cell layout library. Afterward, operation S713 is executed to form a routing pattern to the standard cell layouts and the substitute cell layouts in the layout plan after adjustment. Then, operation S705 is executed to synthesize the semiconductor device according to the layout plan after adjustment.

Aforesaid embodiments in FIG. 11 and FIG. 12 have disclosed the cell layout library 600 and the synthesis method 700. In response to that the standard cell layout fails in the design rule check (DRC) or a signal electromagnetic (SEM) simulation test, the substitute cell layouts are utilized to replace the standard cell layouts. In some embodiments, each of the substitute cell layouts includes a tapping connector. The tapping connector can reduce the current density of a bypassing signal (e.g., a clock signal), and reduce the risk to fail in DRC. The cell layout in the embodiment reduces a complexity of routing pattern at lower-layer is reduced, and also reduce the SEM impact from other wirings to the clock-related pin.

In some embodiments, a cell layout is disclosed that includes a cell block and a tapping connector. The cell block has a clock-related pin. The clock-related pin being disposed at a Nth metal layer in the cell layout. The tapping connector is disposed at at least one metal layer above the Nth metal layer and stacked above the clock-related pin of the cell block. The tapping connector is electrically connected to the clock-related pin and forms an equivalent tapping point of the clock-related pin of the cell block. In some embodiments, N is an integer greater than or equal to 0.

Also disclosed is a cell layout library stored on a non-transitory computer readable storage. The cell layout library is associated with cell layouts for defining a layout design used by a processor for fabrication of at least one aspect of a semiconductor device. The cell layout library includes a standard cell layout and at least one substitute cell layout corresponding to the standard cell layout. The standard cell layout includes a first cell block having a clock-related pin. The at least one substitute cell layout corresponds to the standard cell layout. Each of the at least one substitute cell layout includes a second cell block and a tapping connector. The second cell block is equivalent to the first cell block of the standard cell layout. The tapping connector is stacked above a clock-related pin of the second cell block. The tapping connector forms an equivalent tapping point of the clock-related pin of the second cell block.

A synthesis method is also disclosed that includes the operations below. A semiconductor device is planned according to standard cell layouts in a cell layout library. A routing pattern is formed to the standard cell layouts. A design rule check (DRC) or a signal electromagnetic simulation test is performed on the routing pattern. At least one of the standard cell layouts failed in the design rule check or the signal electromagnetic simulation test is identified. The standard cell layouts failed in the design rule check or the signal electromagnetic simulation test is replaced with substitute cell layouts in the cell layout library.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a cell block comprising a pin, the pin being disposed at a Nth metal layer in a cell layout; and
a tapping connector disposed at at least one metal layer above the Nth metal layer and stacked above the pin of the cell block, the tapping connector being electrically coupled to the pin and forming an equivalent tapping point of the pin of the cell block, wherein N is an integer greater than or equal to 0,
wherein the equivalent tapping point and the pin are vertically overlapped, and fabrication of the device is initiated after a design rule check (DRC) or a signal electromagnetic (SEM) simulation test is passed,
wherein the tapping connector comprises:
a plurality of first metal interconnects disposed at a (N+1)th metal layer above the Nth metal layer, the plurality of first metal interconnects being parallel to each other, at least one of the plurality of first metal interconnects being stacked over the pin and being electrically coupled to the pin; and
at least one second metal interconnect disposed at a (N+2)th metal layer and stacked over the plurality of first metal interconnects, the second metal interconnect being electrically coupled to the plurality of first metal interconnects, and the at least one second metal interconnect forming the equivalent tapping point of the pin of the cell block.

2. The device of claim 1, wherein a first width of one of the plurality of first metal interconnects is 1 to 3 times as wide as a minimum trace width on the (N+1)th metal layer according to design rules, a second width of the second metal interconnect is 1 to 3 times as wide as a minimum trace width on the (N+2)th metal layer according to the design rules, and the second width is 0.5 to 3 times as wide as the first width.

3. The device of claim 1, wherein
the at least one second metal interconnect comprises: a plurality of second metal interconnects being stacked over and perpendicular to the plurality of first metal interconnects, the second metal interconnects being electrically coupled to the plurality of first metal interconnects, and the plurality of second metal interconnects forming the equivalent tapping point of the pin of the cell block.

4. The device of claim 3, wherein a width of one of the plurality of first metal interconnects is 1 to 3 times as wide as a minimum trace width on the (N+1)th metal layer according to design rules.

5. The device of claim 1, wherein a width of the at least one second metal interconnect is 1 to 3 times as wide as a minimum trace width on the (N+2)th metal layer according to design rules.

6. The device of claim 1, wherein the cell block is stored in a cell layout library and regarded as a standard cell layout, the cell block and the tapping connector are stored in the cell layout library and regarded as a substitute cell layout of the standard cell layout.

7. The device of claim 6, wherein the pin is a clock-related pin of the cell block and in response to the standard cell layout adopted in a synthesis process failing in the design rule check (DRC) or the signal electromagnetic (SEM) simulation test, the substitute cell layout is utilized to replace the standard cell layout in the synthesis process.

8. The device of claim 1, further comprising:
a via array disposed between and connecting the at least one second metal interconnect and one of the plurality of first metal interconnects.

9. A device, comprising:
at least one substitute cell layout corresponding to a standard cell layout, the standard cell layout comprising a first cell block having a pin, each of the at least one substitute cell layout comprising a second cell block and a tapping connector, the second cell block being equivalent to the first cell block of the standard cell layout, the tapping connector being stacked above a pin of the second cell block, the tapping connector forming an equivalent tapping point of the pin of the second cell block,
wherein the tapping connector comprises:
a plurality of first metal interconnects disposed at a (N+1)th metal layer, the plurality of first metal interconnects being parallel to each other, at least one of the plurality of first metal interconnects being stacked over the pin of the second cell block and being electrically coupled to the pin of the second cell block; and
a second metal interconnect disposed at a (N+2)th metal layer and stacked over the plurality of first metal interconnects, the second metal interconnect being electrically coupled to the plurality of first metal interconnects, and the second metal interconnect forming the equivalent tapping point of the pin of the second cell block, and
wherein the equivalent tapping point and the pin of the second cell block are vertically overlapped, and fabrication of the device is initiated after a design rule check (DRC) or a signal electromagnetic (SEM) simulation test is passed.

10. The device of claim 9, wherein the pin of the first cell block and the pin of the second cell block are clock-related pins, and the substitute cell layout is utilized to replace the standard cell layout failed in the design rule check (DRC) or the signal electromagnetic (SEM) simulation test.

11. The device of claim 9, wherein the tapping connector within one substitute cell layout comprises widened metal interconnects pre-stacked above the pin of the second cell block.

12. The device of claim 11, wherein a width of each widened metal interconnect is 1 to 3 times as wide as a minimum trace width on a corresponding metal layer according to design rules.

13. The device of claim 9, wherein the tapping connector within one substitute cell layout comprises an interconnect-mesh pre-stacked above the pin of the second cell block.

14. The device of claim 13, wherein the interconnect-mesh comprises a plurality of metal interconnects disposed on two different metal layers, the metal interconnects are electrically coupled to each other.

15. The device of claim 9, wherein the second metal interconnect is perpendicular to the plurality of first metal interconnects.

16. The device of claim 9, further comprising:
a via array disposed between and connecting the second metal interconnect and one of the plurality of first metal interconnects.

17. A method, comprising:
arranging standard cell layouts each comprising a first cell block having a pin and a tapping connector electrically coupled to the pin of the first cell block to form an equivalent tapping point of the pin of the first cell block, wherein the equivalent tapping point and the pin are vertically overlapped, and the tapping connector comprises a plurality of first metal interconnects and a second metal interconnect, the plurality of first metal interconnects being disposed at a (N+1)th metal layer and being parallel to each other, at least one of the plurality of first metal interconnects being stacked over the pin and being electrically coupled to the pin, the second metal interconnect being disposed at a (N+2)th metal layer and stacked over the plurality of first metal interconnects, the second metal interconnect being electrically coupled to the plurality of first metal interconnects, the second metal interconnect forming the equivalent tapping point of the pin of the first cell block;

planning a semiconductor device according to the standard cell layouts in a cell layout library;

forming a routing pattern to the standard cell layouts;

performing a design rule check (DRC) or a signal electromagnetic simulation test on the routing pattern;

identifying at least one of the standard cell layouts failed in the design rule check or the signal electromagnetic simulation test;

replacing the standard cell layouts failed in the design rule check or the signal electromagnetic simulation test with substitute cell layouts in the cell layout library; and initiating fabrication of the semiconductor device after the design rule check or the signal electromagnetic simulation test is passed, wherein planning the semiconductor device, forming the routing pattern, performing the design rule check (DRC) or the signal electromagnetic simulation test, identifying the at least one of the standard cell layouts, replacing the standard cell layouts, or a combination thereof is performed by using a computer.

18. The method of claim 17, wherein each of the standard cell layouts comprises a second cell block having a pin, the second cell block is equivalent to the first cell block of the standard cell layouts, and the tapping connector is stacked above the pin of the first cell block.

19. The method of claim 18, wherein, in response to the standard cell layout failing the design rule check (DRC) or the signal electromagnetic (SEM) simulation test, the substitute cell layouts are utilized to replace the standard cell layouts.

20. The method of claim 18, wherein the tapping connector within one substitute cell layout of the standard cell layouts comprises widened interconnects or an interconnect-mesh pre-stacked above the pin of the first cell block.

* * * * *